US009147703B2

(12) United States Patent
Kao et al.

(10) Patent No.: US 9,147,703 B2
(45) Date of Patent: Sep. 29, 2015

(54) CMOS IMAGE SENSOR STRUCTURE

(71) Applicant: TAIWAN SEMICONDUCTOR MANUFACTURING COMPANY, LTD., Hsin-Chu (TW)

(72) Inventors: Min-Feng Kao, Chiayi (TW); Dun-Nian Yaung, Taipei (TW); Jen-Cheng Liu, Minsyong Township (TW); Chun-Chieh Chuang, Tainan (TW); Wen-De Wang, Minsyong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 12 days.

(21) Appl. No.: 14/057,140

(22) Filed: Oct. 18, 2013

(65) Prior Publication Data

US 2014/0035013 A1    Feb. 6, 2014

Related U.S. Application Data

(62) Division of application No. 13/185,204, filed on Jul. 18, 2011, now Pat. No. 8,564,085.

(51) Int. Cl.
*H01L 31/14* (2006.01)
*H01L 27/146* (2006.01)

(52) U.S. Cl.
CPC .......... *H01L 27/146* (2013.01); *H01L 27/1464* (2013.01); *H01L 27/14632* (2013.01); *H01L 27/14636* (2013.01); *H01L 27/14687* (2013.01)

(58) Field of Classification Search
CPC .............. H01L 21/76254; H01L 21/84; H01L 27/1203
USPC ............. 257/E21.568, E27.112, E27.133, 21, 257/292; 438/455, 458, 94
See application file for complete search history.

(56) References Cited

U.S. PATENT DOCUMENTS

| 6,992,025 | B2 * | 1/2006 | Maa et al. ...................... 438/795 |
| 7,390,725 | B2 * | 6/2008 | Maa et al. ...................... 438/458 |
| 7,445,977 | B2 * | 11/2008 | Chu et al. ...................... 438/197 |
| 7,704,815 | B2 * | 4/2010 | Chu et al. ...................... 438/197 |
| 8,049,277 | B2 * | 11/2011 | Yu et al. ......................... 257/347 |
| 8,164,126 | B2 * | 4/2012 | Moon et al. .................... 257/292 |
| 2006/0019464 | A1 * | 1/2006 | Maa et al. ...................... 438/458 |
| 2006/0054891 | A1 * | 3/2006 | Chu et al. ......................... 257/65 |

(Continued)

OTHER PUBLICATIONS

Joy Johnson, "Hydrogen Ion-Implantation in Smart-Cut® SOI Fabrication Technique", 6.774 Term Project, 18 pages.

*Primary Examiner* — Jaehwan Oh
(74) *Attorney, Agent, or Firm* — Haynes and Boone, LLP

(57) ABSTRACT

Provided is a method of fabricating an image sensor device. The method includes providing a first substrate having a radiation-sensing region disposed therein. The method includes providing a second substrate having a hydrogen implant layer, the hydrogen implant layer dividing the second substrate into a first portion and a second portion. The method includes bonding the first portion of the second substrate to the first substrate. The method includes after the bonding, removing the second portion of the second substrate. The method includes after the removing, forming one or more microelectronic devices in the first portion of the second substrate. The method includes forming an interconnect structure over the first portion of the second substrate, the interconnect structure containing interconnect features that are electrically coupled to the microelectronic devices.

18 Claims, 11 Drawing Sheets

(56) References Cited

U.S. PATENT DOCUMENTS

| | | | |
|---|---|---|---|
| 2006/0073708 A1* | 4/2006 | Maa et al. | 438/795 |
| 2007/0218647 A1* | 9/2007 | Chu et al. | 438/455 |
| 2008/0203452 A1* | 8/2008 | Moon et al. | 257/292 |
| 2008/0246063 A1* | 10/2008 | Liu et al. | 257/290 |
| 2008/0251821 A1* | 10/2008 | Ko et al. | 257/292 |
| 2009/0004831 A1* | 1/2009 | Chu et al. | 438/479 |
| 2009/0242949 A1* | 10/2009 | Adkisson et al. | 257/292 |
| 2009/0283807 A1* | 11/2009 | Adkisson et al. | 257/292 |
| 2009/0286346 A1* | 11/2009 | Adkisson et al. | 438/65 |
| 2009/0303366 A1* | 12/2009 | Gambino et al. | 348/308 |
| 2009/0309160 A1* | 12/2009 | Cohen et al. | 257/350 |
| 2010/0044758 A1* | 2/2010 | Cohen et al. | 257/255 |
| 2010/0096718 A1* | 4/2010 | Hynecek et al. | 257/460 |
| 2010/0155882 A1* | 6/2010 | Castex | 257/507 |
| 2010/0176371 A1* | 7/2010 | Lochtefeld | 257/13 |
| 2010/0291742 A1* | 11/2010 | Wells et al. | 438/239 |
| 2010/0301447 A1* | 12/2010 | Yu et al. | 257/506 |
| 2011/0025892 A1* | 2/2011 | Hibbeler et al. | 348/294 |
| 2011/0101420 A1* | 5/2011 | Patel | 257/225 |
| 2011/0242351 A1* | 10/2011 | Shoji | 348/222.1 |
| 2012/0231602 A1* | 9/2012 | Wells et al. | 438/381 |
| 2012/0255600 A1* | 10/2012 | Bedell et al. | 136/255 |
| 2012/0322229 A1* | 12/2012 | Castex | 438/459 |
| 2013/0020662 A1* | 1/2013 | Kao et al. | 257/431 |

* cited by examiner

CMOS IMAGE SENSOR STRUCTURE

PRIORITY DATA

This application is a divisional patent application of U.S. patent application Ser. No. 13/185,204, filed on Jul. 18, 2011, entitled "Novel CMOS Image Sensor Structure," the disclosure of which is hereby incorporated by reference in its entirety.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels located in a substrate, including photodiodes and transistors, that can absorb radiation projected toward the substrate and convert the sensed radiation into electrical signals.

A back side illuminated (BSI) image sensor device is one type of image sensor device. These BSI image sensor devices are operable to detect light projected from its backside. A BSI image sensor device has a relatively thin silicon substrate (e.g., a few microns thick) in which light-sensing pixels are formed. The quantum efficiency and the full well capacity of the BSI image sensors may depend on the size of the radiation-sensing region. Existing methods of fabricating BSI image sensor devices may place constraints on the size of the radiation-sensing region, thereby limiting the quantum efficiency and the full well capacity.

Hence, while existing BSI image sensor devices have been generally adequate for their intended purposes, they have not been entirely satisfactory in every aspect.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
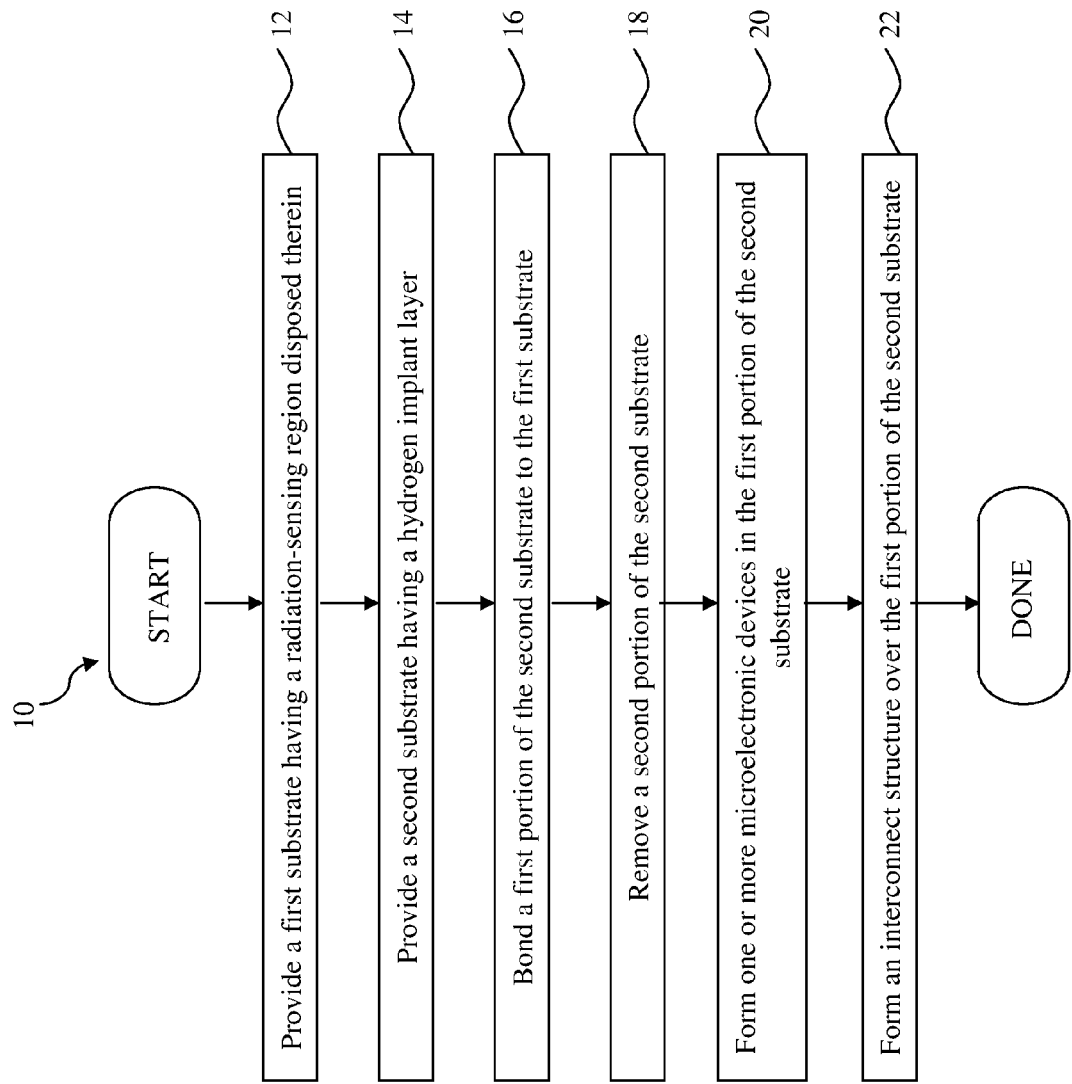
FIG. 1 is a flowchart illustrating a method for fabricating an image sensor device according to various aspects of the present disclosure.

Illustrated in FIG. 1 is a flowchart of a method 10 for fabricating a back-side illuminated (BSI) image sensor device according to various aspects of the present disclosure. Referring to FIG. 1, the method 10 begins with block 12 in which a first substrate having a radiation-sensing region disposed therein is provided. The method 10 continues with block 14 in which a second substrate having a hydrogen implant layer is provided. The hydrogen implant layer divides the second substrate into a first portion and a second portion. The method 10 continues with block 16 in which the first portion of the second substrate is bonded to the first substrate. The method 10 continues with block 18 in which the second portion of the second substrate is removed. The method 10 continues with block 20 in which one or more microelectronic devices are formed in the first portion of the second substrate. The method 10 continues with block 22 in which an interconnect structure is formed over the first portion of the second substrate. The interconnect structure contains interconnect features that are electrically coupled to the microelectronic devices.

FIGS. 2 to 11 are diagrammatic fragmentary sectional side views of embodiments of a BSI image sensor device at various stages of fabrication according to aspects of the method 10 of FIG. 1. It is understood that FIGS. 2 to 11 have been simplified for a better understanding of the inventive concepts of the present disclosure and may not be drawn to scale.

Figure 2:
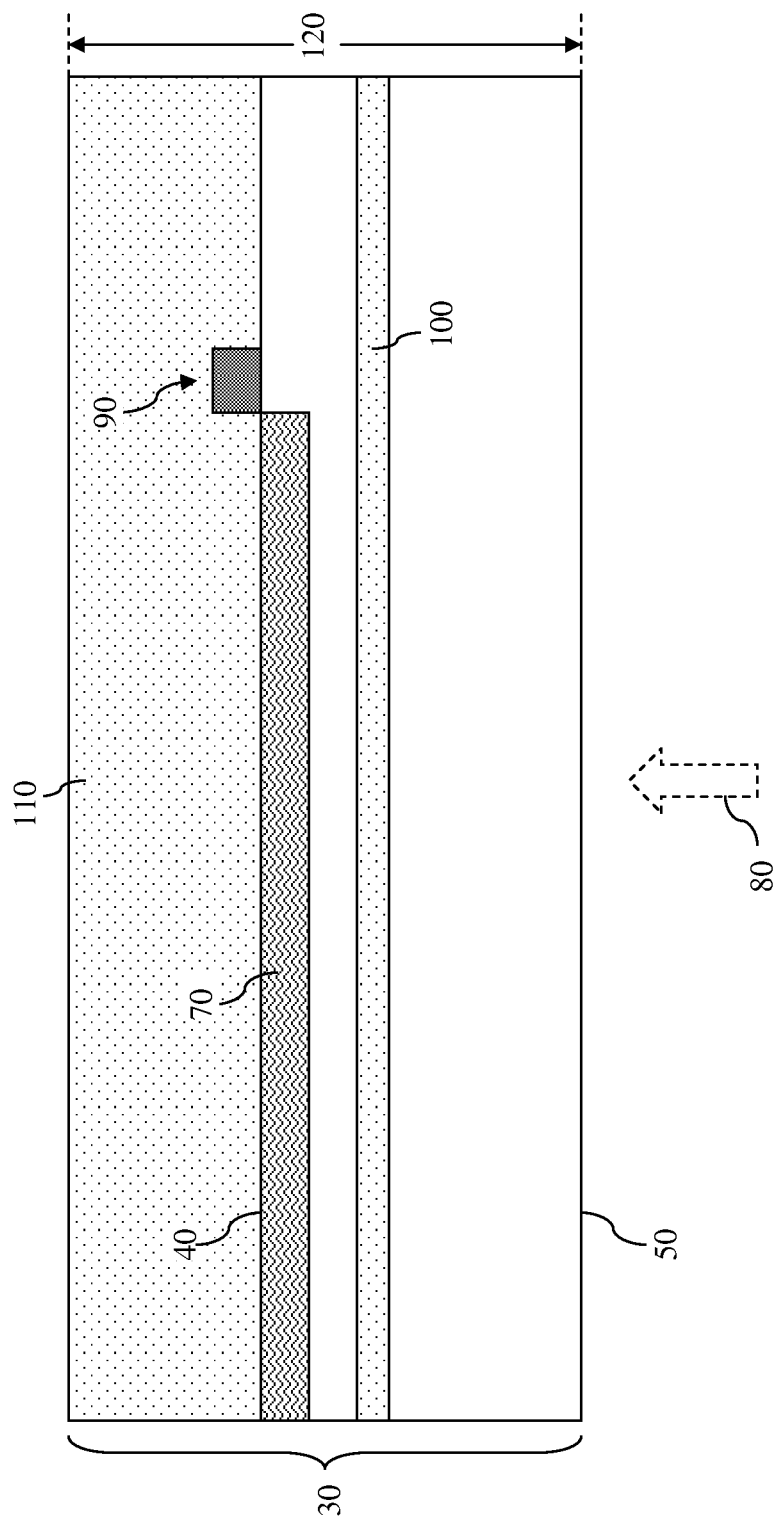
FIGS. 2-11 are diagrammatic fragmentary cross-sectional side views of an image sensor device at various stages of fabrication in accordance with various aspects of the present disclosure.

With reference to FIG. 2, a device substrate 30 is provided. The device substrate 30 is a silicon substrate doped with a p-type dopant such as boron (for example a p-type substrate). Alternatively, the device substrate 30 could be another suitable semiconductor material. For example, the device substrate 30 may be a silicon substrate that is doped with an n-type dopant such as phosphorous or arsenic (an n-type substrate). The device substrate 30 could include other elementary semiconductors such as germanium and diamond. The device substrate 30 could optionally include a compound semiconductor and/or an alloy semiconductor. Further, the device substrate 30 could include an epitaxial layer (epi layer) and may be strained for performance enhancement.

The device substrate 30 (also referred to as a wafer) has a front side 40 and a back side 50. The front and back sides 40-50 correspond to front and back surfaces of the device substrate 30, respectively. Radiation-sensing regions are formed in the device substrate 30 near the front side 40. For the sake of simplicity, a pixel 70 is illustrated in FIG. 2 as a radiation-sensing region, but it is understood that any number of pixels may be implemented in the device substrate 30. The pixel 70 is operable to sense radiation, such as an incident light 80, that is projected toward the device substrate 30 from the back side 50. In other words, the light 80 enters the substrate 30 through the back side 50 of the substrate. The pixel 70 includes a photodiode in the present embodiment. The pixel 70 may also be referred to as a radiation-detection device or a light-sensor.

The pixel 70 may have a suitable junction depth, thickness, width, and so forth. In the embodiment shown, the pixel 70 is formed by performing an implantation process on the device substrate 30 from the front side 40. In an embodiment, the implantation process includes doping the device substrate 30 with a p-type dopant such as boron. In an alternative embodiment, the implantation process may include doping the device substrate 30 with an n-type dopant such as phosphorous or arsenic. In other embodiments, the pixel 70 may also be formed by a diffusion process.

A transfer gate device 90 is formed on the device substrate 30. The transistor gate device 90 may include a transistor gate formed on the device substrate 30 from the front side 40. The transistor gate device 90 may also include source and drain regions formed in the device substrate 30. In an embodiment, a photodiode of the pixel 70 serves as a portion of the transfer gate device 90, for example as a source/drain region.

The device substrate 30 also includes a layer 100 disposed below the pixel 70. In an embodiment, the layer 100 is a dielectric layer and may include silicon oxide. The device substrate 30 may also include a layer 110 formed over the pixel 70 and the transfer gate transistor 90 at the front side 40. In one embodiment, the layer 110 includes a dielectric material such as silicon oxide. In another embodiment, the layer 110 may include bulk silicon. The device substrate 30 has an initial thickness 120 that is in a range from about 100 microns (um) to about 3000 um. In the present embodiment, the initial thickness 120 is in a range from about 500 um to about 1000 um.

Although not specifically illustrated, the device substrate 30 may includes isolation structures that provide electrical and optical isolation between the pixel 70 and adjacent pixels. The isolation structures may be shallow trench isolation (STI) structures that are formed of a dielectric material such as silicon oxide or silicon nitride. For example, the STI structures may be formed by etching openings into the substrate 30 from the front side 40 and thereafter filling the openings with the dielectric material. In other embodiments, the isolation structures may include deep trench isolation (DTI) structures or doped isolation structures, such as heavily doped n-type or p-type regions.

The pixel 70 and the isolation structures discussed above are formed in a region of the device substrate 30 referred to as a pixel region. The device substrate 30 may also include a periphery region, a bonding pad region, and a scribe line region. The periphery region includes microelectronic devices that need to be kept optically dark, for example an application-specific integrated circuit (ASIC) device, or a reference pixel that is used to establish a baseline of an intensity of light to be sensed.

The bonding pad region includes a region where one or more bonding pads will be formed in a later processing stage, so that electrical connections between the components inside the device substrate 30 and external devices may be established. The scribe line region includes a region that separates one semiconductor die from an adjacent semiconductor dies. The scribe line region may be cut therethrough in a later fabrication process to separate adjacent dies before the dies are packaged and sold as integrated circuit chips. For the sake of simplicity, only the pixel region is illustrated, and the details of the periphery region, the bonding pad region, and the scribe line region are not specifically illustrated herein.

Figure 3:
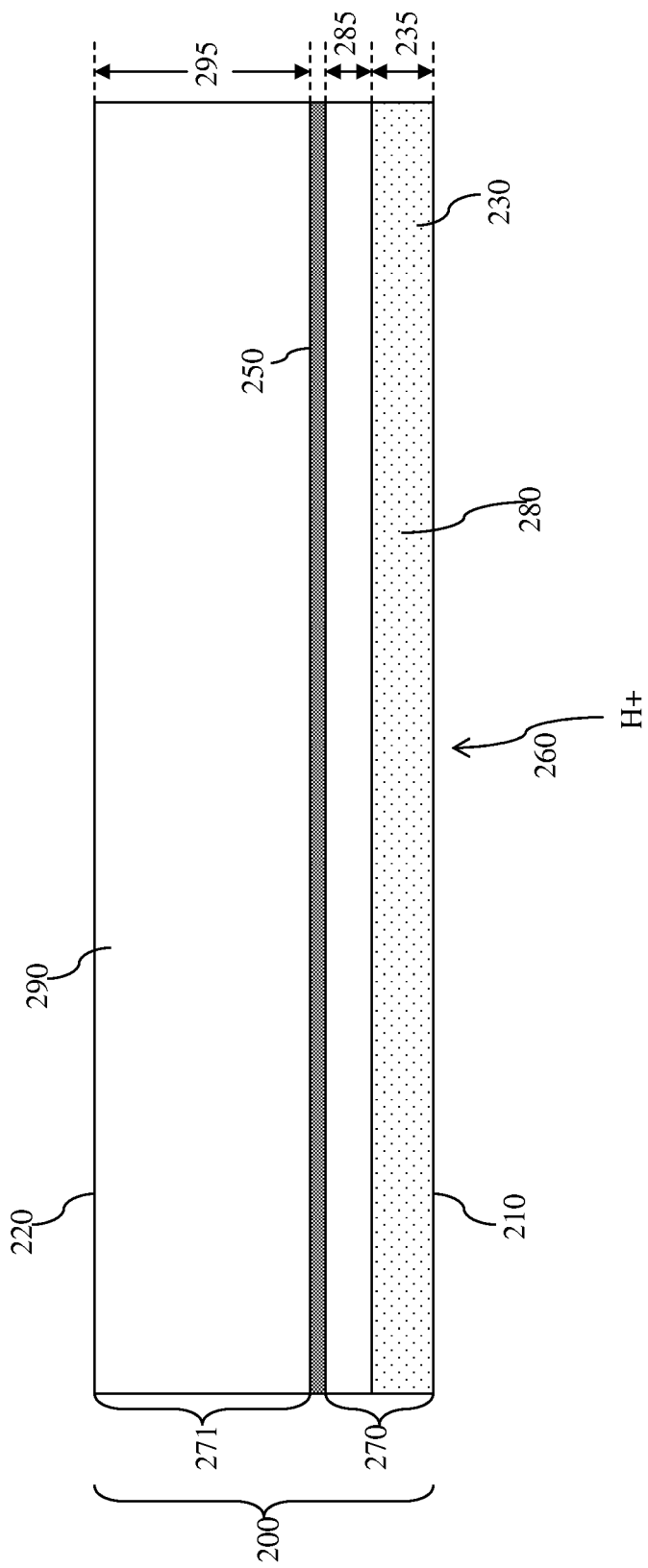

Referring to FIG. 3, a substrate 200 (also referred to as a wafer) is provided. The substrate 200 has a side 210 and an opposite side 220. A dielectric layer 230 is formed at the side 210 of the substrate 200. In an embodiment, the dielectric layer 230 includes a silicon oxide material and is formed by thermally oxidizing the substrate 200 from the side 210. The dielectric layer 230 has a thickness 235. In an embodiment, the thickness 235 is in a range from about 0 um to about 500 um.

Thereafter, a layer 250 is formed in the substrate 200. In an embodiment, the layer 250 is formed by a hydrogen ion implantation process 260. The hydrogen ion implantation process 260 has a dosage range from about $3\times10^{16}$ ions/cm$^2$ to about $1\times10^{17}$ ions/cm$^2$, and is performed at a process temperature in a range from about 225 degrees Celsius to about 300 degrees Celsius. The layer 250 may also be referred to as a hydrogen implant layer. The implanted hydrogen causes a layer of gaseous microbubbles to form at or along the hydrogen implant layer. Alternatively stated, the hydrogen implant layer contains the layer of gaseous microbubbles.

The layer 250 divides the substrate 200 into portions 270 and 271. The portion 270 includes the dielectric layer 230, the hydrogen implant layer 250, and a silicon layer 280 that is disposed between the dielectric layer 230 and the hydrogen implant layer 250. The silicon layer 280 has a thickness 285. In an embodiment, the thickness 285 is in a range from about 100 Angstroms to about 50000 Angstroms. The portion 271 includes a silicon layer 290 that is disposed on a side of the hydrogen implant layer 250 opposite from the silicon layer 280. The silicon layer 290 has a thickness 295. In an embodiment, the thickness 295 is in a range from about 10 um to about 770 um.

Figure 4:
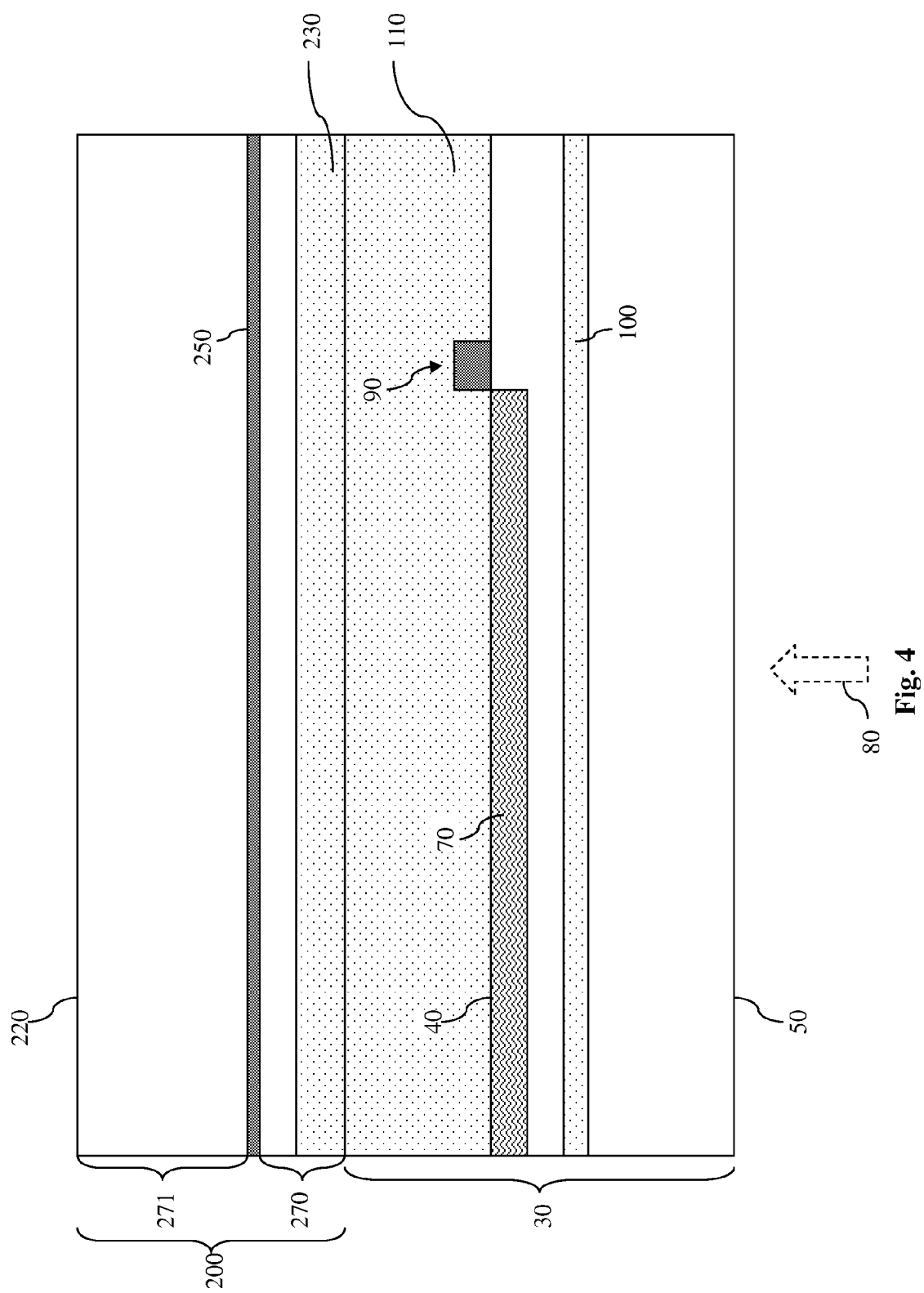

Referring now to FIG. 4, the substrate 30 of FIG. 2 and the substrate 200 of FIG. 3 are cleaned and bonded together. Specifically, the front side 40 of the substrate 30 is bonded to the side 210 of the substrate 200. In an embodiment, the bonding is carried out using a hydrophilic bonding process at about a room temperature (at or near 25 degrees Celsius). Thereafter, the bonded substrates 30 and 200 are checked to be void-free using infra-red spectroscopy and magic mirror observations.

Figure 5:
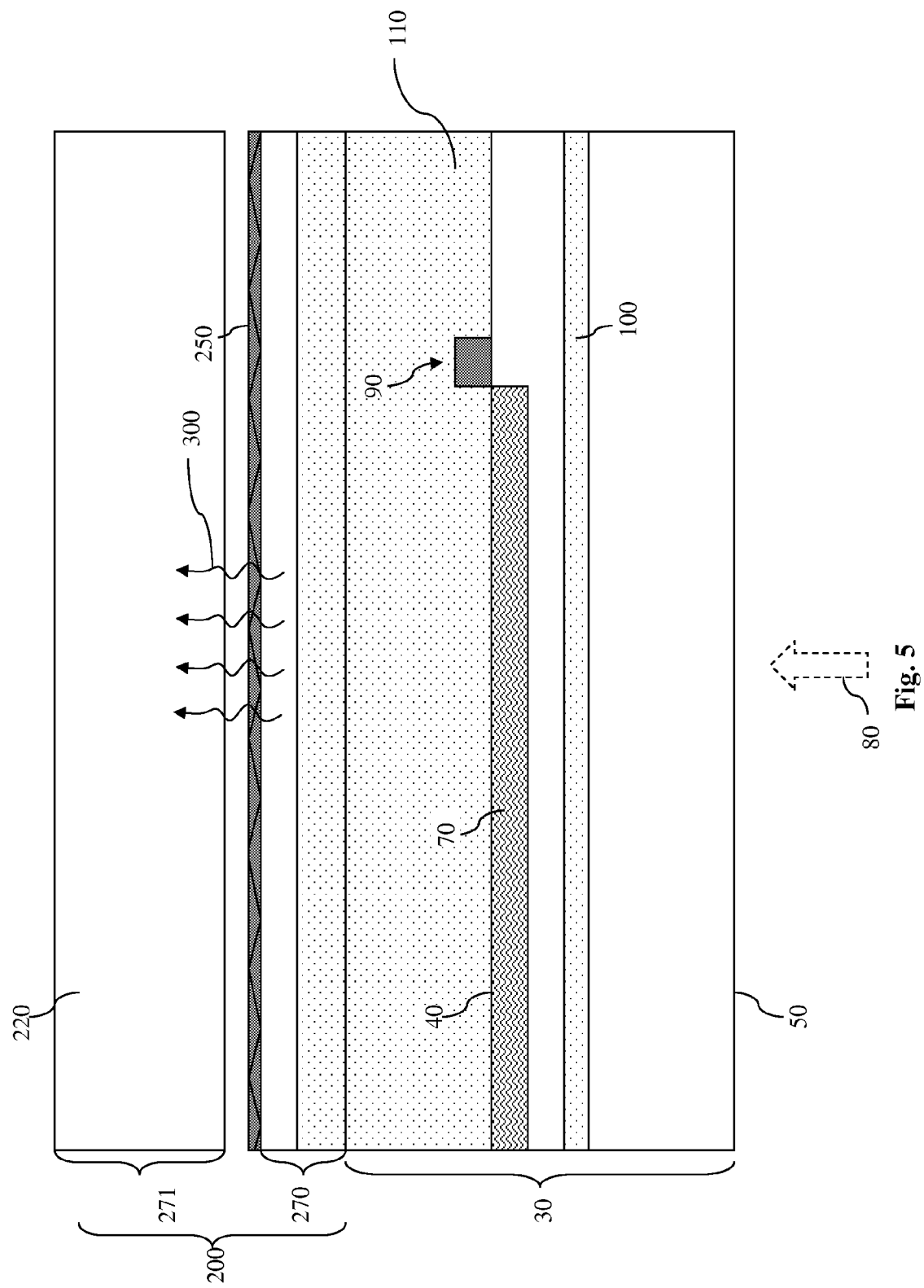

Referring now to FIG. 5, an annealing process 300 is performed to the bonded substrates 30 and 200. In an embodiment, the annealing process includes a two-phase annealing process. In a first phase annealing, the annealing is performed at a process temperature from about 400 degrees Celsius to about 600 degrees Celsius. The first phase annealing causes blistering and flaking at the hydrogen implant layer 250. During the annealing, the microbubbles grow due to Ostwald ripening and ultimately supply the internal force necessary to cause the portion 271 of the substrate 200 to be split or separated from the portion 270 (and from the bonded substrate 30 therebelow). The separated portion 271 may be recycled and suitably used again in other applications. Following the first phase annealing, a second phase annealing is performed at a process temperature from about 1050 degrees Celsius to about 1150 degrees Celsius. The chemical bonds are strengthened in the second phase annealing.

Figure 6:
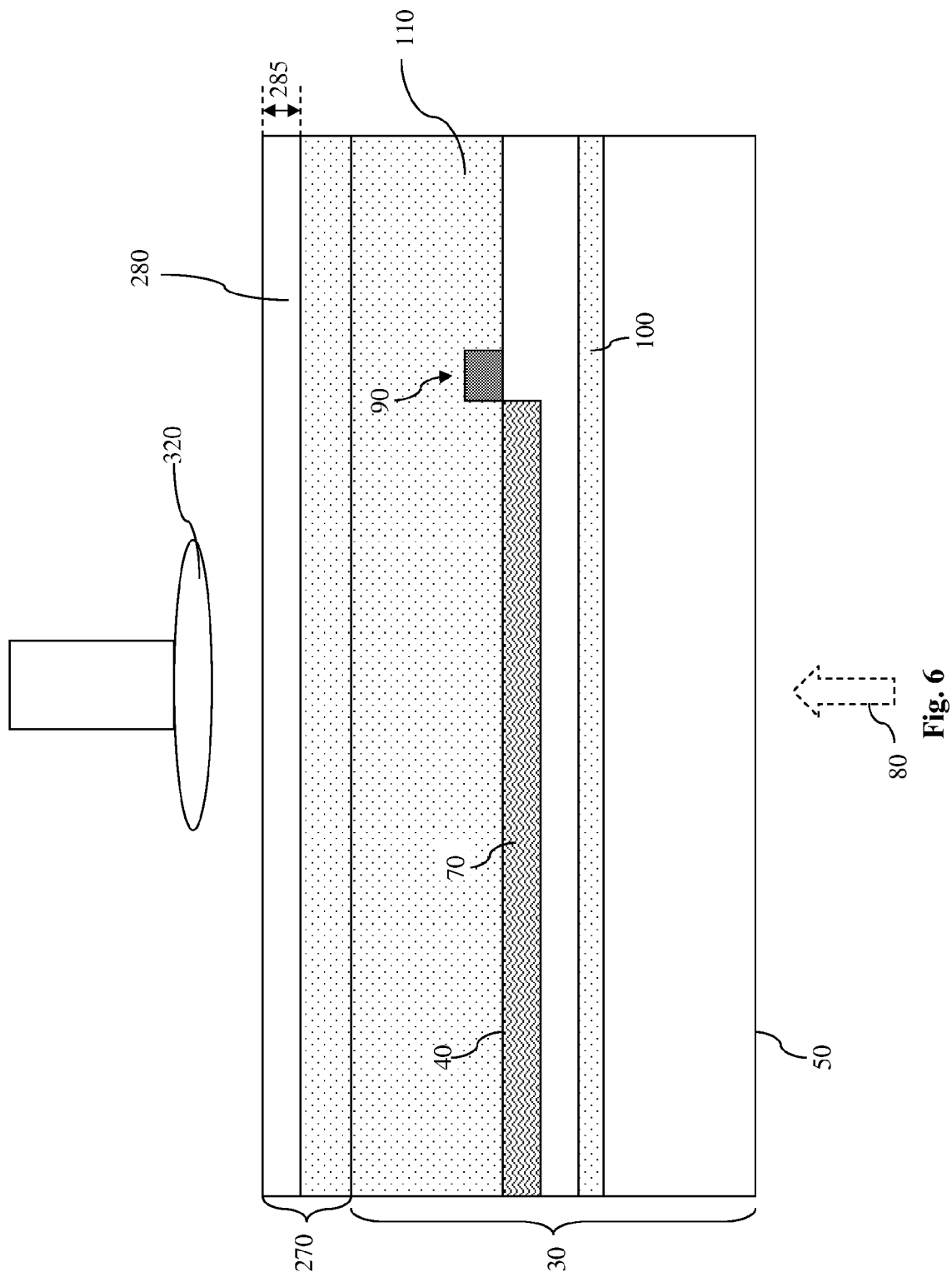

Referring now to FIG. 6, a polishing process 320 is performed on a remaining portion of the substrate 270. In an embodiment, the polishing process includes a chemical mechanical polishing (CMP) process. The polishing process 320 is performed at least in part to reduce the roughness of the exposed surface of the substrate 270 as a result of the splitting. The polishing process 320 may include a plurality of polishing steps. The hydrogen implant layer 250 is removed by the polishing process 320. In some embodiments, the thickness 285 of the remaining silicon layer 280 may also be reduced by the polishing process 320. After the polishing process 320 is performed, the exposed surface of the silicon layer 280 (or of the substrate 270) is substantially smooth and planar.

Figure 7:
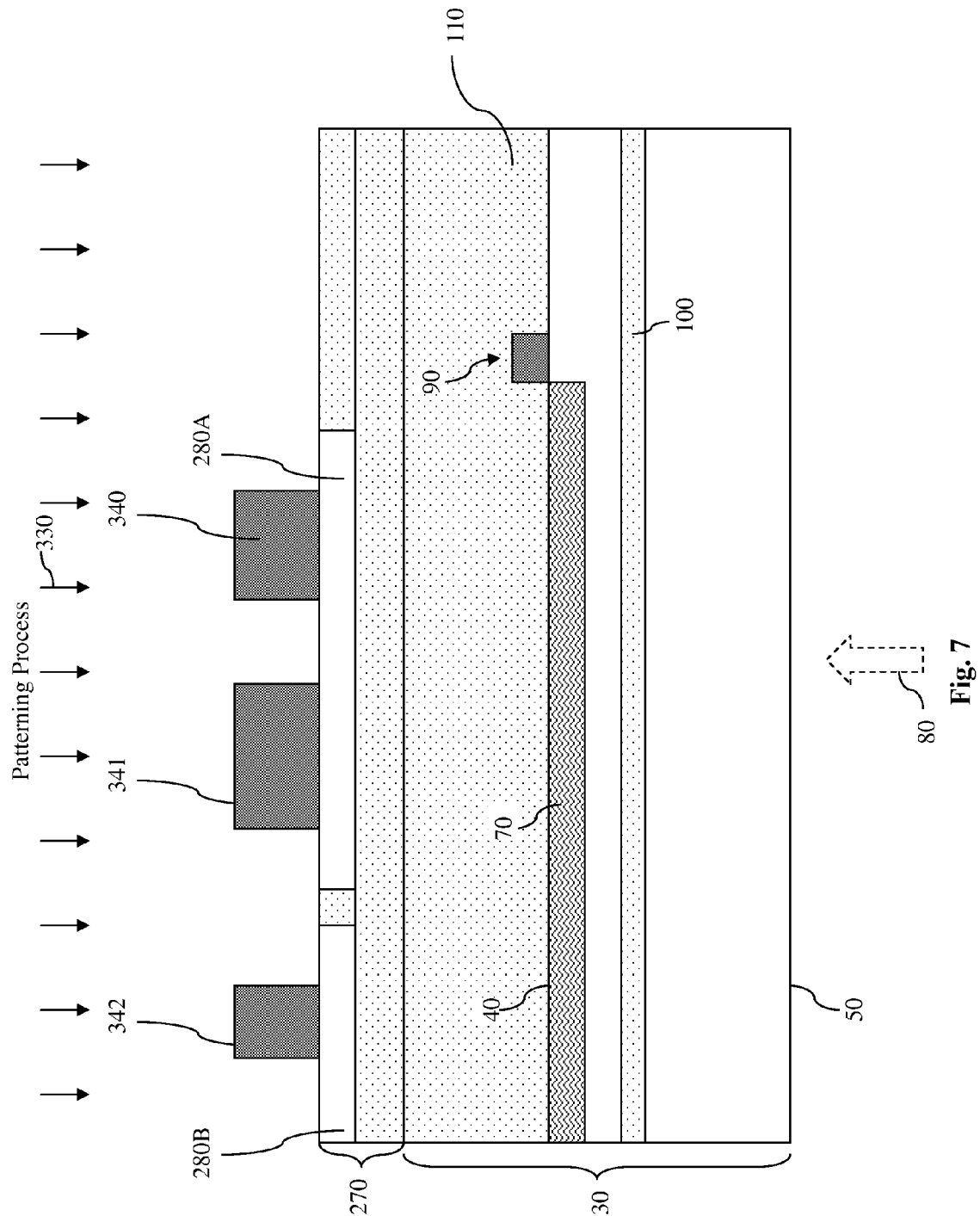

Referring now to FIG. 7, a patterning process 330 is performed to the silicon layer 280. The patterning process 330 may include a photolithography process and may includes one or more exposing, developing, rinsing, and baking steps (not necessarily in that order). As a result of the patterning process 330, the silicon layer 280 is patterned into a plurality of segments. For the sake of simplicity, segments 280A and 280B are illustrated herein. Although not shown, isolation structures may be formed between the patterned segments to provide electrical isolation.

Thereafter, a plurality of microelectronic devices is formed in or on the segments 280A-280B. The microelectronic devices include active or passive devices that may have doped regions formed in the silicon layer segments 280A-280B and/or transistor gates formed over these silicon layer segments. In an embodiment, these microelectronic devices include a row selector device 340, a source follower device 341, and a reset gate device 342. The row selector device 340, source follower device 341, and reset gate device 342 may each include a transistor component, for example a field effect transistor (FET) component that includes a gate and source/drain regions. The row selector device 340, source follower device 341, and reset gate device 342 may also be referred to as "readout" devices.

Figure 8:
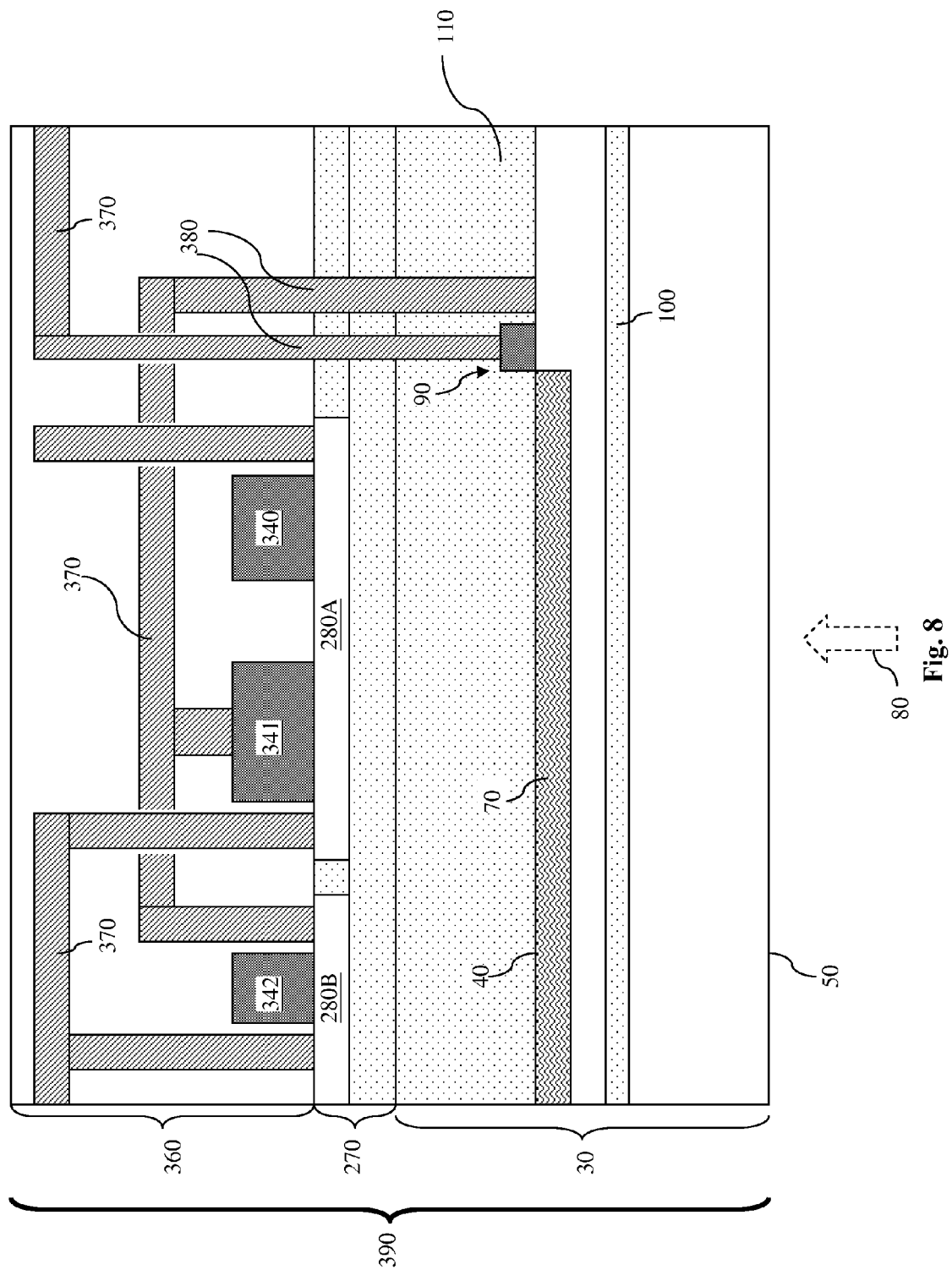

Referring now to FIG. 8, an interconnect structure 360 is formed over the substrate 270 (and over the devices 340-341). The interconnect structure 360 includes a plurality of patterned dielectric layers and conductive layers that provide interconnections (e.g., wiring) between the various doped features, circuitry, and input/output of the substrates 30 and 270. The interconnect structure 360 includes an interlayer dielectric (ILD) and a multilayer interconnect (MLI) structure. The MLI structure includes contacts, vias and metal lines. For purposes of illustration, a plurality of conductive lines 370 and vias/contacts 380 are shown in FIG. 8, it being understood that the conductive lines 370 and vias/contacts 380 illustrated herein are merely exemplary, and the actual positioning and configuration of the conductive lines and vias/contacts may vary depending on design needs.

Through the interconnect structure 360, devices on the substrate 30 can be electrically coupled to the devices on the substrate 270. For example, the conductive lines 370 and the vias/contacts 380 provide electrical connections between the transfer gate device 90 and the row selector device 340, the source follower device 341, and the reset gate device 342. In an embodiment, some of the vias 380 are through-silicon vias (TSV). For example, the via 380 coupled to the transfer gate device 90 is a TSV. It is understood that the vias 380 coupled to the transfer gate device 90 may be formed using standard CMOS processes due to the layer 110 being a dielectric material, rather than Si.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 380) and horizontal connection (for example, conductive lines 370). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Figure 9:
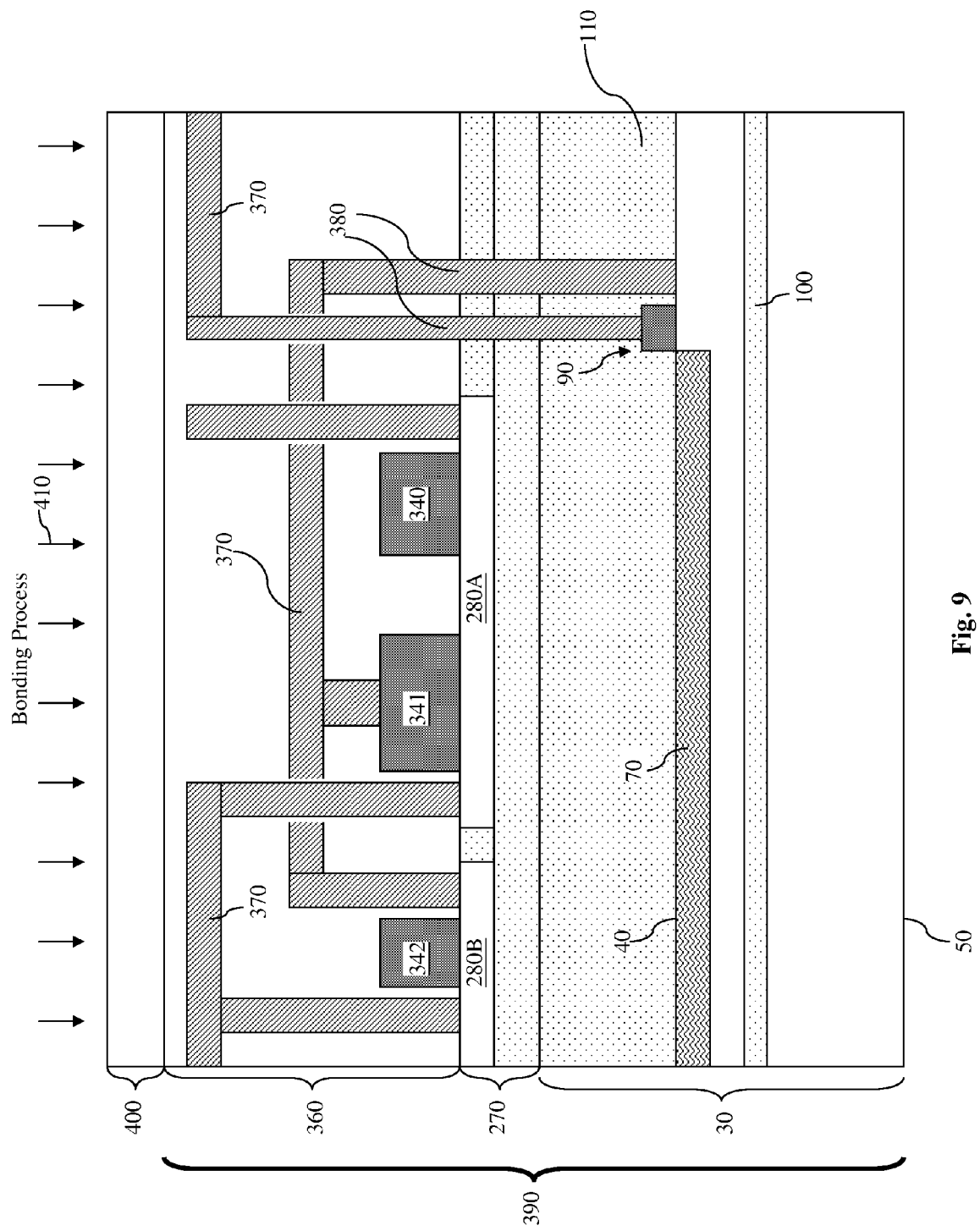

At this point, the substrate 30, the portion of the substrate 270, and the interconnect structure 360 may be collectively referred to as a device substrate 390. Referring now to FIG. 9, a carrier substrate 400 (also referred to as a carrier wafer or a handling substrate) is bonded to the interconnect structure 360 through a bonding process 410. In an embodiment, the bonding process 410 bonds the carrier substrate 400 to the device substrate 390 by molecular forces—a technique known as direct bonding or optical fusion bonding. In other embodiments, the bonding process 410 may be carried out using other techniques known in the art, such as metal diffusion or anodic bonding. The carrier substrate 400 in the present embodiment includes a silicon material. Alternatively, the carrier substrate 400 may include glass or another suitable material.

Although not specifically illustrated, a buffer layer may be formed on the interconnect structure 360 before it is bonded to the carrier substrate 400. The buffer layer may include a dielectric material such as silicon oxide or silicon nitride and may be formed by CVD, PVD, or other suitable techniques. The buffer layer may be planarized by a CMP process to form a smooth surface. The buffer layer provides electrical isolation between the device substrate 30 and the carrier substrate 400. The carrier substrate 400 provides protection for the various devices formed on the device substrate 30 and the substrate 270, such as the pixel 70, the transfer gate device 90, and the microelectronic devices 340-342. The carrier substrate 400 also provides mechanical strength and support for processing the back side of the device substrate 30 as discussed below.

Figure 10:
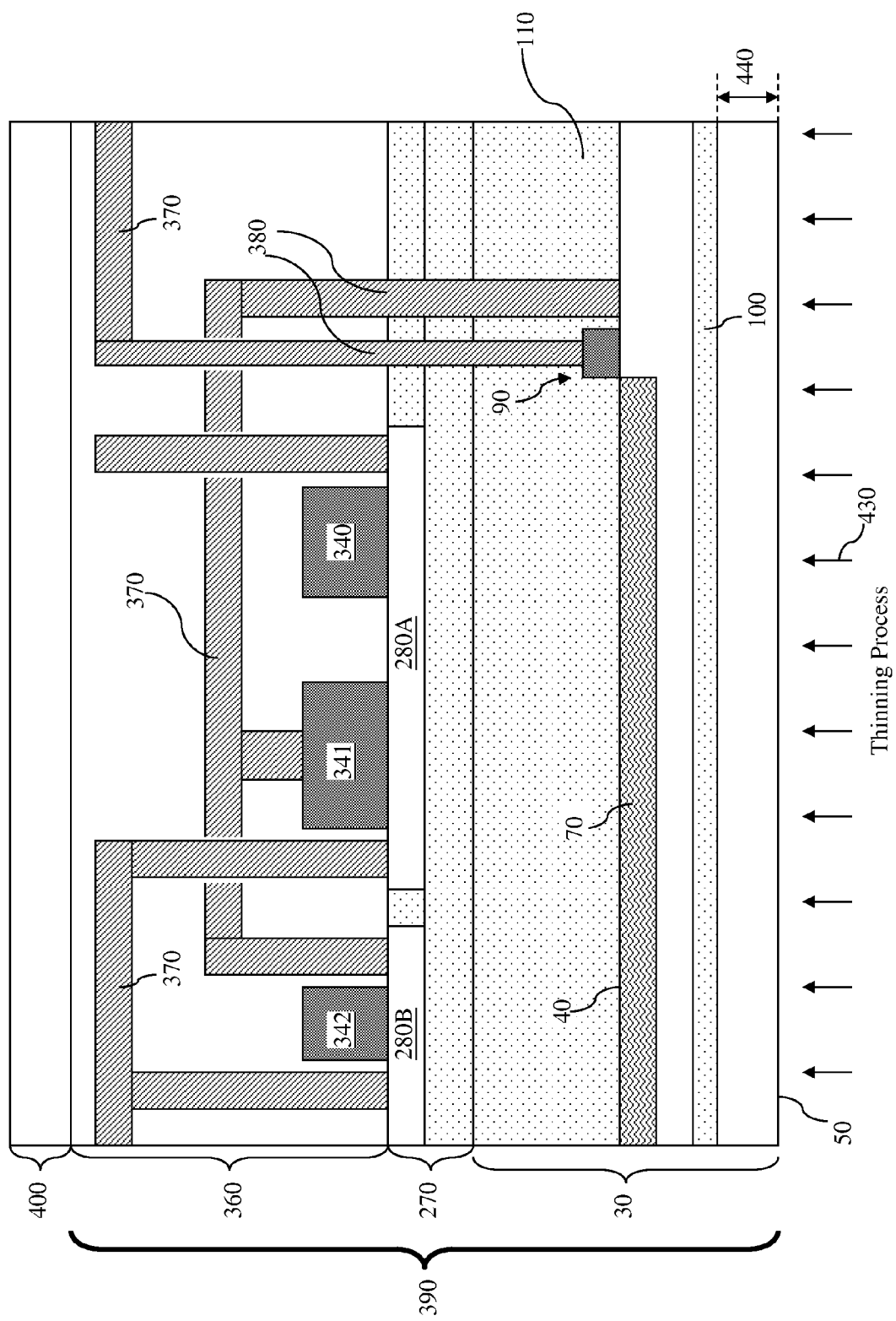

Referring now to FIG. 10, back side processing of the device substrate 30 is performed. A thinning process 430 is performed to thin the device substrate 30 from the backside 50. The thinning process 430 may include a mechanical grinding process and a chemical thinning process. A substantial amount of substrate material may be first removed from the device substrate 30 during the mechanical grinding process. Afterwards, the chemical thinning process may apply an etching chemical to the back side 50 of the device substrate 30 to further thin the device substrate 30 to a thickness 440, which is on the order of a few microns. In the present embodiment, the thickness 440 is less than about 5 um, for example about 2-3 um. In an embodiment, the thickness 440 is greater than at least about 1 um. It is also understood that the particular thicknesses disclosed in the present disclosure are mere examples and that other thicknesses may be implemented depending on the type of application and design requirements. After the device substrate 30 is thinned down, further back-side processing may be performed.

Figure 11:
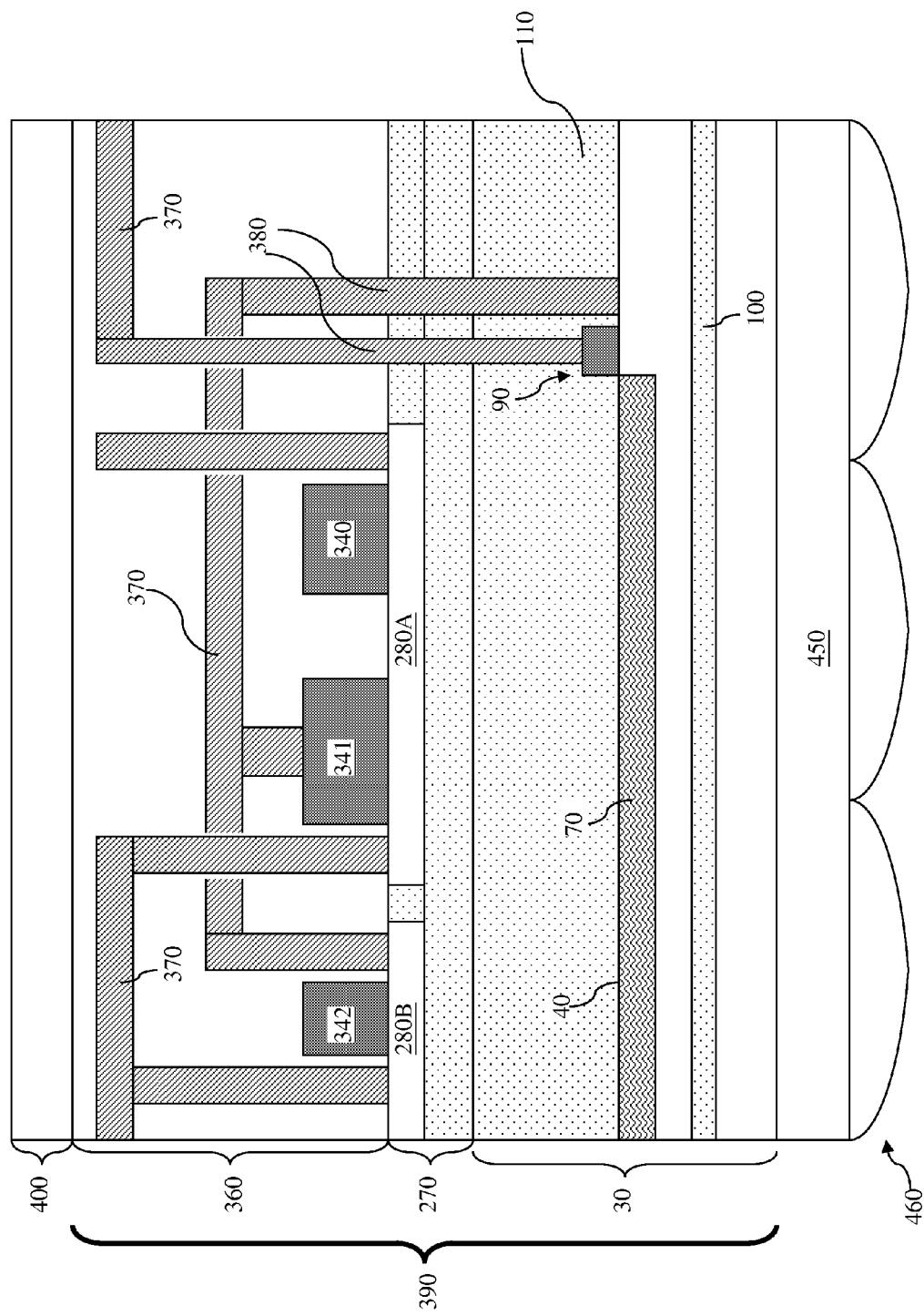

Referring now to FIG. 11, a color filter layer 450 may be formed over the thinned substrate 30A on the back side 50. The color filter layer 450 may contain a plurality of color filters that may be positioned such that the incoming radiation is directed thereon and therethrough. The color filters may include a dye-based (or pigment based) polymer or resin for filtering a specific wavelength band of the incoming radiation, which corresponds to a color spectrum (e.g., red, green, and blue).

Thereafter, a micro-lens layer 460 containing a plurality of micro-lenses is formed over the color filter layer 450. The micro-lenses direct and focus the incoming radiation toward specific radiation-sensing regions in the device substrate 30, such as the pixel 70. The micro-lenses may be positioned in various arrangements and have various shapes depending on a refractive index of material used for the micro-lens and distance from a sensor surface. The device substrate 30 may undergo an optional laser annealing process before the forming of the color filter layer 450 or the micro-lens layer 460. In this manner, a back side illuminated image sensor (BSI) device is formed by the processes discussed above.

It is understood that an anti-reflective coating (ARC) layer and/or a passivation layer may be formed between the device substrate 30A and the color filter layer 450. The ARC layer may include a material that reduces the reflection of incoming light. The passivation layer may include a material that has good sealing properties to prevent moisture, dust, or other contaminants from getting inside the BSI image sensor device.

It is understood that the sequence of the fabrication processes described above is not intended to be limiting. Some of the layers or devices may be formed according to different processing sequences in other embodiments than what is shown herein. Furthermore, some other layers may be formed but are not illustrated herein for the sake of simplicity.

The embodiments of the present disclosure offer advantages over conventional BSI image sensors, it being understood that other embodiments may offer different advantages, and that no particular advantage is required for any embodiment. One advantage is an increase in quantum efficiency and full well capacity. In some conventional BSI image sensor devices, the radiation-sensing regions are formed on the same wafer as many other microelectronic devices, such as row selector devices, source follower devices, and/or reset gate devices. These other microelectronic devices consume much wafer area, thereby limiting the amount of radiation that can be absorbed and detected by the radiation-sensing regions. In comparison, these microelectronic devices and the radiation-sensing regions are formed on separate wafers. As such, the radiation-sensing region can be formed to have a greater size or area to enhance its quantum efficiency and full well capacity.

Another advantage offered by the present disclosure is relatively easy alignment. The fabrication of certain traditional 3-Dimensional image sensor devices may place strict requirements on alignment or overlay between two wafers. For example, for traditional 3-D image sensor devices, interconnections may be formed on separate wafers first, and thereafter the wafers are bonded together. As such, accurate alignment between these wafers may be critical. But as semiconductor device sizes continue to decrease, accurate alignment or overlay becomes more difficult and may increase fabrication costs and lead to lower yields. In comparison, the fabrication process flow of the present disclosure obviates the strict alignment requirements, since the interconnections are formed after the wafers containing electronic devices are bonded together.

One of the broader forms of the present disclosure involves a method of fabricating a semiconductor device. The method includes: providing a first substrate having a radiation-sensing region disposed therein; providing a second substrate having a hydrogen implant layer, the hydrogen implant layer dividing the second substrate into a first portion and a second portion; bonding the first portion of the second substrate to the first substrate; after the bonding, removing the second portion of the second substrate; after the removing, forming one or more microelectronic devices in the first portion of the second substrate; and forming an interconnect structure over the first portion of the second substrate, the interconnect structure containing interconnect features that are electrically coupled to the microelectronic devices.

In an embodiment, the method further includes, after the forming the interconnect structure: bonding a third substrate to the interconnect structure in a manner such that the interconnect structure is disposed between the first substrate and the third substrate; and thereafter thinning the first substrate.

In an embodiment, the providing the first substrate is carried out in a manner such that the first substrate has a front side and a back side, the radiation sensing region being operable to sense radiation projected from the back side; the bonding includes bonding the first portion of the second substrate to the front side of the first substrate; and the thinning is performed from the back side.

In an embodiment, the removing the second portion includes performing one or more annealing processes to split the second substrate along the hydrogen implant layer.

In an embodiment, the one or more annealing processes include: a first phase annealing process that is performed at a temperature range from about 400 degrees Celsius to about 600 degrees Celsius; and a second phase annealing process that is performed at a temperature range from about 1050 degrees Celsius to about 1150 degrees Celsius.

In an embodiment, the method further includes: after the removing the second portion, polishing an exposed surface of the second substrate.

In an embodiment, the providing the first substrate is carried out in a manner such that the first substrate includes a transfer gate device disposed adjacent to the radiation-sensing region; the forming the one or more microelectronic devices includes forming at least one of: a source follower device, a reset gate device, and a row selector device; and the forming the interconnect structure is carried out in a manner such that the transfer gate device is electrically coupled to at least one of the microelectronic devices through the interconnect features of the interconnect structure.

In an embodiment, the providing the second substrate includes: forming a dielectric layer on the second substrate; and performing an implant process through the dielectric layer to form the hydrogen implant layer, the hydrogen implant layer being separated from the dielectric layer by a silicon layer; wherein: the first portion of the second substrate includes the dielectric layer and the silicon layer disposed on a first side of the hydrogen implant layer; and the second portion of the second substrate includes a portion of the second substrate disposed on a second side of the hydrogen implant layer that is opposite the first side.

Another one of the broader forms of the present disclosure involves a method of fabricating an image sensor device. The method includes: providing a first wafer that contains a radiation-sensing region disposed therein and a transfer gate component disposed adjacent to the radiation-sensing region; providing a second wafer that contains a dielectric layer and a silicon layer, the silicon layer having a hydrogen layer implanted therein; bonding the first and second wafers together in a manner such that the dielectric layer is bonded to a front side of the first wafer; annealing the second wafer, thereby separating a portion of the second wafer along the hydrogen layer; thereafter forming a plurality of microelectronic components in the silicon layer of a remaining portion of the second wafer that is bonded to the first wafer; forming an interconnect structure over the remaining portion of the second wafer, the interconnect structure containing interconnect components that are electrically coupled to the microelectronic components and the transfer gate component; bonding a third wafer to the interconnect structure; and thereafter thinning the first wafer from a back side opposite the front side.

In an embodiment, the method further includes: after the annealing and before the forming the microelectronic components, polishing a surface of the remaining portion of the second wafer, wherein the polishing removes the hydrogen layer.

In an embodiment, the microelectronic components include at least one of: a source follower, a reset gate, and a row selector.

In an embodiment, the annealing includes: performing a first annealing process at a temperature range from about 400 degrees Celsius to about 600 degrees Celsius; and performing a second annealing process at a temperature range from about 1050 degrees Celsius to about 1150 degrees Celsius.

In an embodiment, the forming the interconnect structure includes forming a through-silicon via that is coupled to the transfer gate component.

In an embodiment, the radiation-sensing region includes a photodiode; the dielectric layer includes silicon oxide; and the interconnect components include metal lines, vias, and contacts.

Yet another one of the broader forms of the present disclosure involves a semiconductor device. The semiconductor device includes: a first substrate having a front side and a back side, the first substrate including a radiation-sensing region and transfer gate device formed at the front side; a second substrate having a dielectric layer and a semiconductor layer, the second substrate being bonded to the front side of the first substrate through the dielectric layer; one or more microelectronic devices formed in the semiconductor layer of the second substrate; an interconnect structure formed on the semiconductor layer, the interconnect structure containing interconnect components that are electrically coupled to the transfer gate device and the one or more microelectronic devices; and a third substrate bonded to the interconnect structure, wherein the interconnect structure is disposed between the second and third substrates.

In an embodiment, the third substrate is substantially thicker than the first and second substrates.

In an embodiment, the one or more microelectronic devices include at least one of: a source follower device, a reset gate device, and a row selector device.

In an embodiment, the interconnect components of the interconnect structure include through-silicon vias, and wherein at least one of the through-silicon vias is electrically coupled to the transfer gate device.

In an embodiment, the first substrate includes a layer formed at the front side and over the radiation sensing region, the layer being one of a dielectric layer and a bulk silicon layer, and wherein the layer of the first substrate is bonded to the dielectric layer of the second substrate.

In an embodiment, the radiation-sensing region includes a photodiode that is operable to sense radiation projected from the back side; the dielectric layer of the second substrate includes silicon oxide; and the semiconductor layer of the second substrate includes silicon.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a first substrate having a first side and a second side;
   a radiation-sensing region disposed in the first substrate, the radiation-sensing region being configured to sense radiation that enters the first substrate through the second side;
   a color filter disposed over the second side of the first substrate;
   a micro-lens disposed over the color filter;
   a first dielectric layer disposed in the first substrate, wherein the first dielectric layer is disposed between the radiation-sensing region and the color filter;
   a gate of a transistor disposed over the first side of the first substrate, wherein the radiation-sensing region serves as a source/drain of the transistor;
   a layer disposed over the first side of the first substrate, the layer being one of: a second dielectric layer and a bulk silicon layer;
   a second substrate bonded to the layer, the second substrate containing a dielectric material and a semiconductor material, wherein the layer is disposed between the first substrate and the second substrate;
   a plurality of micro-electronic devices disposed at least partially over the second substrate; and
   an interconnect structure disposed over the second substrate, wherein the interconnect structure includes a plurality of interconnect elements that electrically couple the transistor to the plurality of the micro-electronic devices.

2. The semiconductor device of claim 1, further comprising: a third substrate bonded to the interconnect structure, wherein the interconnect structure is disposed between the second substrate and the third substrate.

3. The semiconductor device of claim 2, wherein the third substrate is substantially thicker than the first substrate and the second substrate.

4. The semiconductor device of claim 1, wherein the plurality of micro-electronic devices include a reset gate, a source follower, and a row selector.

5. The semiconductor device of claim 1, wherein the plurality of micro-electronic devices are disposed over the semiconductor material of the second substrate.

6. The semiconductor device of claim 1, wherein the interconnect structure includes one or more through-silicon-vias (TSVs) that extend at least partially through the layer disposed between the first substrate and the second substrate.

7. The semiconductor device of claim 6, wherein at least one of the TSVs is in contact with the gate of the transistor.

8. A semiconductor device, comprising:
   a first substrate having a first side and a second side;
   a pixel disposed in the first substrate, the pixel being configured to detect light that enters the first substrate through the second side;
   a color filter layer disposed over the second side of the first substrate;
   a micro-lens layer disposed over the color filter layer;
   a first dielectric layer disposed in the first substrate, the first dielectric layer being disposed between the color filter layer and the pixel;
   a transfer gate transistor device disposed at least partially in the first substrate, wherein the transfer gate transistor device includes a gate component disposed over the pixel, and wherein the pixel functions as a source/drain component of the transfer gate transistor device;
   a second dielectric layer or a bulk silicon layer disposed over the transfer gate transistor device;
   a second substrate attached to the second dielectric layer or the bulk silicon layer, the second substrate containing a plurality of patterned silicon segments;
   a plurality of micro-electronic devices disposed at least partially over the patterned silicon segments of the second substrate;

an interconnect structure disposed over the second substrate, wherein the interconnect structure includes a plurality of interconnect features that are electrically coupled to the plurality of the micro-electronic devices; and a third substrate attached to the interconnect structure, wherein the interconnect structure is disposed between the second substrate and the third substrate, and wherein the third substrate is substantially thicker than the first substrate and the second substrate.

9. The semiconductor device of claim 8, wherein the plurality of micro-electronic devices include a reset gate, a source follower, and a row selector.

10. The semiconductor device of claim 8, wherein the interconnect structure includes one or more through-silicon-vias (TSVs) that extend through the second substrate and at least partially through the second dielectric layer or the bulk silicon layer disposed between the first substrate and the second substrate.

11. The semiconductor device of claim 10, wherein at least one of the TSVs is in contact with the gate component of the transfer gate transistor device.

12. The semiconductor device of claim 8, wherein the third substrate includes a glass substrate.

13. A semiconductor device, comprising:
a first substrate having a front side and a back side, the first substrate including a radiation-sensing region and transfer gate device formed at the front side, wherein the radiation-sensing region serves as a source/drain of the transfer gate device;
a color filter disposed over the back side of the first substrate;
a micro-lens disposed over the color filter;
a first dielectric layer disposed in the first substrate, wherein the first dielectric layer is disposed between the radiation-sensing region and the color filter
a second substrate having a second dielectric layer and a semiconductor layer, the second substrate being bonded to the front side of the first substrate through the second dielectric layer;

one or more microelectronic devices formed in the semiconductor layer of the second substrate;
an interconnect structure formed on the semiconductor layer, the interconnect structure containing interconnect components that are electrically coupled to the transfer gate device and the one or more microelectronic devices; and
a third substrate bonded to the interconnect structure, wherein the interconnect structure is disposed between the second and third substrates.

14. The semiconductor device of claim 13, wherein the third substrate is substantially thicker than the first and second substrates.

15. The semiconductor device of claim 13, wherein the one or more microelectronic devices includes at least one of: a source follower device, a reset gate device, and a row selector device.

16. The semiconductor device of claim 13, wherein the interconnect components of the interconnect structure include through-silicon vias, and wherein at least one of the through-silicon vias is electrically coupled to the transfer gate device.

17. The semiconductor device of claim 13, wherein the first substrate includes a layer formed at the front side and over the radiation sensing region, the layer being one of a third dielectric layer and a bulk silicon layer, and wherein the layer of the first substrate is bonded to the second dielectric layer of the second substrate.

18. The semiconductor device of claim 13, wherein:
the radiation-sensing region includes a photodiode that is operable to sense radiation projected from the back side;
the second dielectric layer of the second substrate includes silicon oxide; and
the semiconductor layer of the second substrate includes silicon.

* * * * *